(12) United States Patent
Uchida et al.

(10) Patent No.: US 7,804,581 B2
(45) Date of Patent: Sep. 28, 2010

(54) EXPOSURE APPARATUS AND METHOD OF MANUFACTURING DEVICE

(75) Inventors: Yoshinori Uchida, Utsunomiya (JP); Yoshiyuki Okada, Sakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 438 days.

(21) Appl. No.: 11/849,698

(22) Filed: Sep. 4, 2007

(65) Prior Publication Data

US 2008/0062391 A1 Mar. 13, 2008

(30) Foreign Application Priority Data

Sep. 7, 2006 (JP) ............................. 2006-243390

(51) Int. Cl.
*G03B 27/68* (2006.01)
(52) U.S. Cl. ............................. 355/55; 355/30; 355/52; 355/53; 355/67
(58) Field of Classification Search ................... 355/52, 355/53, 55, 67, 30, 77; 250/492.2, 548; 430/30
See application file for complete search history.

(56) References Cited

U.S. PATENT DOCUMENTS

| 5,424,552 | A | * | 6/1995 | Tsuji et al. | ................... | 250/548 |
| 6,088,082 | A | | 7/2000 | Yonekawa | ................... | 355/53 |
| 6,614,503 | B1 | | 9/2003 | Uzawa | ................... | 355/30 |
| 6,995,828 | B2 | | 2/2006 | Okada | ................... | 355/30 |

(Continued)

FOREIGN PATENT DOCUMENTS

JP 10-199782 7/1998

(Continued)

OTHER PUBLICATIONS

Japanese Office Action dated Jan. 26, 2009, issued in corresponding Japanese patent application No. 2006-243390.

(Continued)

*Primary Examiner*—Hung Henry Nguyen
*Assistant Examiner*—Colin Kreutzer
(74) *Attorney, Agent, or Firm*—Fitzpatrick, Cella, Harper & Scinto

(57) ABSTRACT

An exposure apparatus for exposing a substrate to light during an exposure period. A projection optical system projects light from a pattern of a reticle onto the substrate. The projection optical system includes at least one optical element driven to adjust aberration of the projection optical system. A first calculator calculates compensation data based on a temporal characteristic of heat influence, which represents a change in aberration due to heat influence of the exposure in the projection optical system in accordance with (i) an elapsed time of a non-exposure period from a time when the exposure period shifts to a non-exposure period, and (ii) exposure period data which represents the time when the exposure period shifts to the non-exposure period. A second calculator calculates each of a plurality of driving amounts of the at least one optical element, based on the compensation data calculated by the first calculator, and each of a plurality of timing signals generated at a gradually decreasing interval upon a shift from the exposure period to the non-exposure period, on the basis of the exposure period data. A driver drives the at least one optical element during the non-exposure period based on each of the plurality of driving amounts calculated by the second calculator.

5 Claims, 11 Drawing Sheets

U.S. PATENT DOCUMENTS

| | | | |
|---|---|---|---|
| 7,164,464 B2 | 1/2007 | Okada | 355/53 |
| 2004/0179175 A1* | 9/2004 | Okada | 355/52 |
| 2006/0114437 A1* | 6/2006 | Akhssay et al. | 355/55 |
| 2007/0013895 A1 | 1/2007 | Okada | 355/72 |
| 2007/0085986 A1 | 4/2007 | Okada | 355/30 |

FOREIGN PATENT DOCUMENTS

| | | |
|---|---|---|
| JP | 2001-085292 | 3/2001 |
| JP | 2004-281697 | 10/2004 |
| JP | 2005-51147 | 2/2005 |

OTHER PUBLICATIONS

Japanese Office Action dated Aug. 22, 2008, issued in corresponding Japanese patent application No. 2006-243390.

* cited by examiner

EXPOSURE APPARATUS AND METHOD OF MANUFACTURING DEVICE

This application claims the benefit of Japanese Patent Application No. 2006-243390, filed Sep. 7, 2006, which is hereby incorporated by reference herein in its entirety.

BACKGROUND OF THE INVENTION

1. Field of the Invention

The present invention relates to an exposure apparatus and a method of manufacturing a device.

2. Description of the Related Art

Along with the recent micropatterning of semiconductor integrated circuits, such as an IC and an LSI, a demand has arisen for further improving the resolution, overlay accuracy, and throughput of a projection exposure apparatus. A problem in terms of the imaging characteristics of exposure light has conventionally been posed. That is, a lens of a projection optical system thermally deforms and changes in refractive index upon absorbing exposure light, to result in aberration, as an error of the optical characteristic of the projection optical system.

The projection magnification of the lens of the projection optical system sometimes changes for each shot region of a substrate (also called a wafer) to result in aberration. To solve this problem, Japanese Patent Laid-Open No. 10-199782 discloses a technique of calculating an amount of lens driving corresponding to an amount of projection magnification change, for each shot region, based on projection magnification data, and driving the lens of the projection optical system in the optical axis direction. This makes it possible to adjust or to correct the projection magnification.

Even during non-exposure, the lens of the projection optical system sometimes deforms due to the influence of heat absorbed upon exposure, to result in aberration during the next exposure. To prevent this problem, driving the lens of the projection optical system at the start of the next exposure makes it possible to adjust or to correct aberration due to its thermal deformation.

From the viewpoint of the imaging characteristics of the exposure light, it is becoming difficult to tolerate aberration that occurs due to even a slight change in atmospheric pressure. Under an environment in which the exposure apparatus is installed, the atmospheric pressure sometimes changes rapidly, albeit, only slightly, due to a human factor, to result in aberration. To solve this problem, Japanese Patent Laid-Open No. 2001-085292 discloses a technique of coping with a case wherein the atmospheric pressure changes about 0.5 hPa/sec upon opening/closing a door of a clean room. In this case, a barometer using a laser interferometer with good response detects a change in atmospheric pressure to drive the lens of the projection optical system or to change the wavelength of light from an exposure light source, in accordance with the change in atmospheric pressure. This makes it possible to adjust or to correct aberration due to a change in atmospheric pressure.

In general, aberrations that occur upon a change in atmospheric pressure are very large, relative to projection magnification and focus, and, hence, need to be adjusted or reduced. On the other hand, aberrations of, for example, distortion, sphere, coma, astigmatism, and curvature of field are relatively small, and, hence, cannot pose any problems in terms of the exposure characteristic.

Assume that an alignment measurement system of the TTL (Through The Lens) scheme is used for measurement (to be referred to as alignment measurement hereafter), for alignment between a reticle (also called a mask or original) and a wafer. Driving the lens of the projection optical system immediately before the start of alignment measurement makes it possible to reduce aberration that occurs during alignment measurement.

In the techniques described in Japanese Patent Laid-Open Nos. 10-199782 and 2001-085292, aberration is corrected in the interval of shot exposure, during shot exposure, at the start of exposure, or at the start of alignment measurement.

However, Japanese Patent Laid-Open Nos. 10-199782 and 2001-085292 do not disclose any method of correcting aberration during a period (non-exposure period) from the end of exposure until the start of the next exposure, such as a wafer exchange period, reticle exchange period, or periodical maintenance period. If, for example, the non-exposure period is long, the amount of driving of the lens of the projection optical system, for aberration correction, is sometimes calculated based on data of an exposure period immediately before the start of exposure and data of the non-exposure period. Since the lens of the projection optical system tends to be driven based on the thus calculated lens driving amount information, a relatively large amount of driving becomes necessary for the lens of the projection optical system during the exposure period. This often requires a long settling time after driving the lens of the projection optical system. Consequently, the throughput of processing by the exposure apparatus may be lowered.

The atmospheric pressure sometimes changes greatly during the non-exposure period, such as the wafer exchange period, reticle exchange period, or periodical maintenance period. Even in this case, the amount of driving of the lens of the projection optical system, for aberration correction, is sometimes calculated based on atmospheric pressure data immediately before the start of exposure. Since the lens of the projection optical system tends to be driven based on the thus calculated lens driving amount information, a relatively large amount of driving amount becomes necessary for the lens of the projection optical system during the exposure period. This often requires a long settling time after driving the lens of the projection optical system. Consequently, the throughput of processing by the exposure apparatus may be lowered.

If aberration is not corrected, to suppress a decrease in the throughput of processing by the exposure apparatus, the exposure accuracy may become lower.

In some cases, aberration is corrected only at the start of alignment measurement during a period (alignment measurement period) for alignment measurement. Even after the start of alignment measurement, however, aberration may occur when a long period of alignment time is spent, to improve the overlay accuracy or when the atmospheric pressure changes greatly during alignment measurement. The aberration sometimes causes an alignment measurement error. This may similarly result in a decrease in exposure accuracy.

SUMMARY OF THE INVENTION

The present invention has been made in consideration of the above background, and has, as its exemplary object, to improve throughput of a process, including aberration adjustment, performed by an exposure apparatus.

According to a first aspect, the present invention provides an exposure apparatus for exposing a substrate to light, the apparatus comprising:

a projection optical system configured to project light from a reticle onto the substrate, the projection optical system including at least one optical element driven to adjust aberration of the projection optical system;

a driver configured to drive the at least one optical element; and a calculator configured to calculate a target amount to which the driver drives the at least one optical element, wherein the apparatus is configured so that the driver drives the at least one optical element a plurality of times, based on outputs from the calculator in a non-exposure period, during which the substrate is not exposed to light.

According to a second aspect, the present invention provides a method of manufacturing a device, the method comprising steps of:

exposing a substrate to light using an exposure apparatus of the present invention;

developing the exposed substrate; and processing the developed substrate to manufacture the device.

According to the present invention, for example, it is possible to improve the throughput of processing, including aberration adjustment, by an exposure apparatus.

Further features of the present invention will become apparent from the following description of exemplary embodiments, with reference to the attached drawings.

DESCRIPTION OF THE EMBODIMENTS

An exposure apparatus according to the preferred first embodiment of the present invention will be described with reference to FIGS. 1 to 4.

Figure 1:
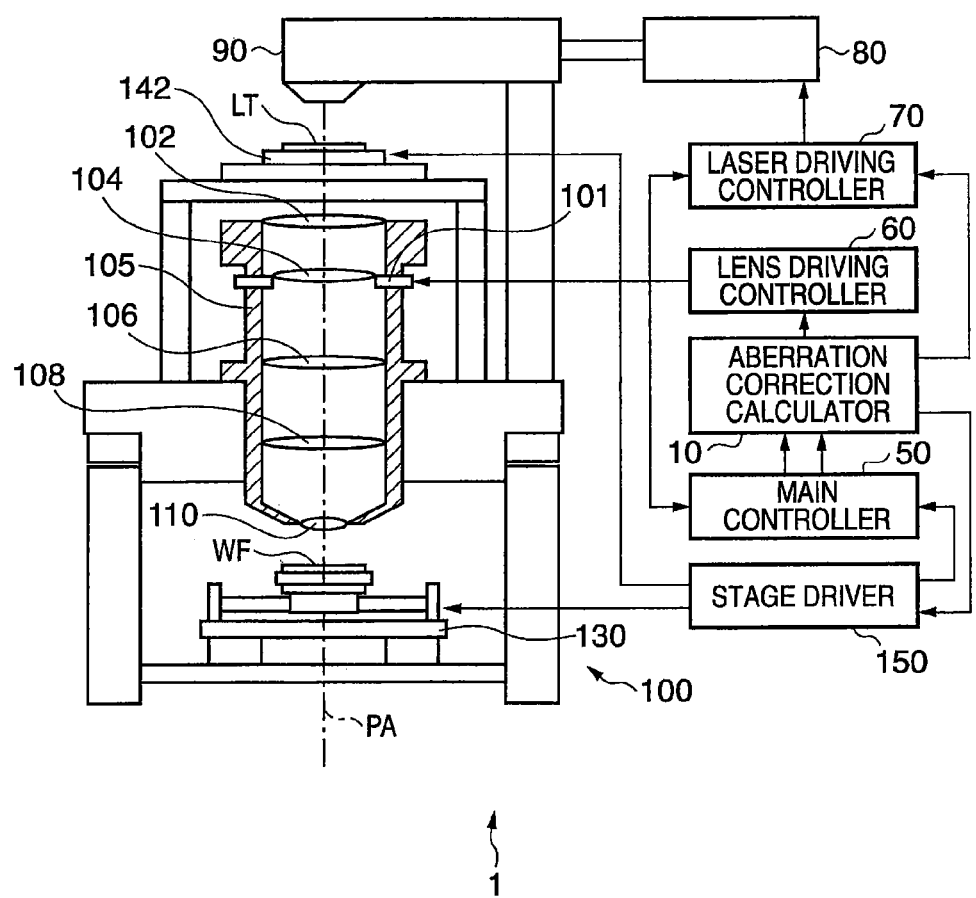
FIG. 1 is a view showing the arrangement of an exposure apparatus according to the first embodiment of the present invention.

The arrangement of the exposure apparatus will be explained with reference to FIG. 1. FIG. 1 is a view showing the arrangement of the exposure apparatus according to the first embodiment of the present invention.

An exposure apparatus 1 comprises a stage driver 150, main controller 50, aberration correction calculator 10, lens driving controller 60, laser driving controller 70, exposure light source 80, illumination optical system 90, and apparatus main body 100.

The exposure light source 80 connects to the illumination optical system 90 in its vicinity.

The illumination optical system 90 is located above the apparatus main body 100.

The apparatus main body 100 is arranged such that an optical axis PA of light guided by the illumination optical system 90 serves as its center. The apparatus main body 100 includes a reticle stage 142, lenses 102, 104, 106, 108, and 110, wafer stage 130, lens support member 105, and lens driving mechanism (lens driver) 101. The reticle stage 142, lenses 102, 104, 106, 108, and 110, and wafer stage 130 align themselves on the optical axis PA. A reticle (original) LT is arranged on the reticle stage 142, such that the optical axis PA serves as its center. A wafer (substrate) WF is arranged on the wafer stage 130, such that the optical axis PA serves as its center. The lens support member 105 supports the lenses 102, 104, 106, 108, and 110, to sandwich them from their edges. The lens driving mechanism 101 clamps one (e.g., the lens 104) of the lenses 102, 104, 106, 108, and 110, to be drivable along the optical axis PA.

The illumination optical system 90 guides exposure light emitted by the exposure light source 80 to the optical axis PA. The light guided to the optical axis PA illuminates the reticle LT arranged on the reticle stage 142. The light transmitted through the reticle LT is further transmitted through the lenses 102, 104, 106, 108, and 110 of the projection optical system, and reaches the wafer WF arranged on the wafer stage 130. The micropattern drawn on the reticle LT is thus transferred on each chip (each shot region) on the wafer WF.

The stage driver 150 electrically connects to the reticle stage 142 and wafer stage 130. The lens driving controller 60 electrically connects to the lens driving mechanism 101. The main controller 50 electrically connects to the aberration correction calculator 10 and laser driving controller 70. The aberration correction calculator 10 electrically connects to the main controller 50, stage driver 150, lens driving controller 60, and laser driving controller 70. The laser driving controller 70 electrically connects to the main controller 50, aberration correction calculator 10, and exposure light source 80.

The laser driving controller 70 receives lens driving amount information from the aberration correction calculator 10. The laser driving controller 70 drives a driving mechanism 88 (see FIG. 2, to be described later) and changes the wavelength of laser light from the exposure light source 80 on the basis of the lens driving amount information.

The lens driving controller 60 receives lens driving amount information from the aberration correction calculator 10. The lens driving controller 60 drives the lens driving mechanism 101 to move the lens 104 along the optical axis PA based on the lens driving amount information.

The main controller 50 controls the entire exposure apparatus 1. The main controller 50 receives exposure start information (e.g., a laser light emission command) from the laser driving controller 70. Alternatively, the main controller 50 receives exposure start information (e.g., a stage driving start command) from the stage driver 150. With this operation, the main controller 50 generates and controls an exposure period and a non-exposure period, as exposure period data. The main controller 50 sends the exposure period data to the aberration correction calculator 10. The non-exposure period here means, for example, a wafer exchange period (substrate exchange period), a reticle exchange period (original exchange period), or a periodical maintenance period.

The stage driver 150 receives lens driving amount information from the aberration correction calculator 10. The stage driver 150 drives the wafer stage 130 and reticle stage 142 by a step-and-repeat scheme or a step-and-scan scheme.

Figure 2:
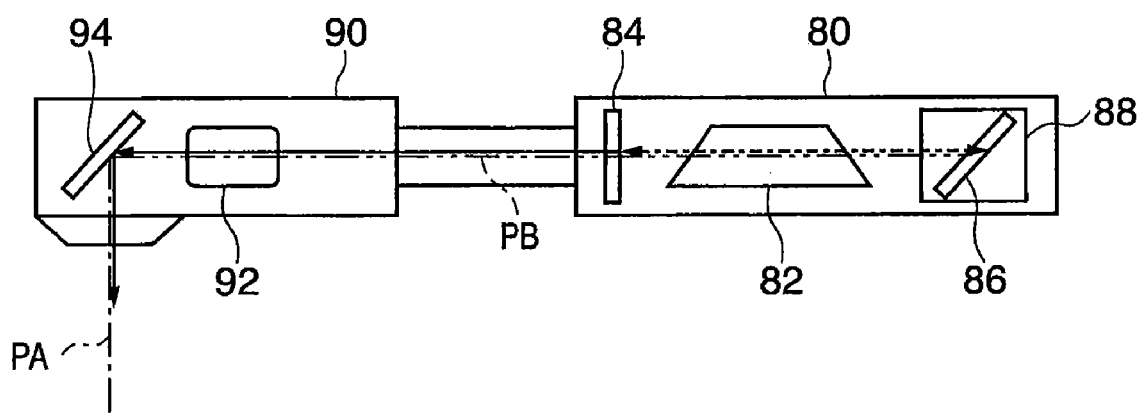
FIG. 2 is a view showing an example of an illumination optical system and an exposure light source according to the first embodiment of the present invention.

The detailed arrangement and operation of the exposure light source 80 and illumination optical system 90 will be explained, with reference to FIG. 2. FIG. 2 is a view showing the arrangement of the exposure light source and illumination optical system. The exposure light source 80 often uses a KrF or an ArF laser light source. FIG. 2 represents a simple arrangement of the exposure light source 80 and illumination optical system 90.

The exposure light source 80 includes a laser resonator 82, transmitting mirror 84, wavelength selection element 86, and driving mechanism 88. The illumination optical system 90 includes a condenser lens 92 and mirror 94. The laser resonator 82, transmitting mirror 84, wavelength selection element 86, driving mechanism 88, condenser lens 92, and mirror 94 align themselves on an optical axis PB. The optical axis PB perpendicularly connects to the optical axis PA on the reflection surface of the mirror 94.

The wavelength selection element 86 uses, for example, a prism, grating, or etalon, to be able to narrow the wavelength range. The driving mechanism 88 controlled by the laser driving controller 70 drives the wavelength selection element 86 to change its angle with respect to the optical axis PB, to be able to change the wavelength of laser light. The driving mechanism 88 may be formed by, for example, a step motor or piezoelectric element.

Laser light emitted by the exposure light source 80 travels along the optical axis PB and is transmitted through the condenser lens 92 in the illumination optical system 90. The mirror 94 guides the light to the optical axis PA to illuminate the reticle.

The arrangement and operation of the aberration correction calculator 10 will be explained with reference to FIGS. 3 and 4.

Figure 3:
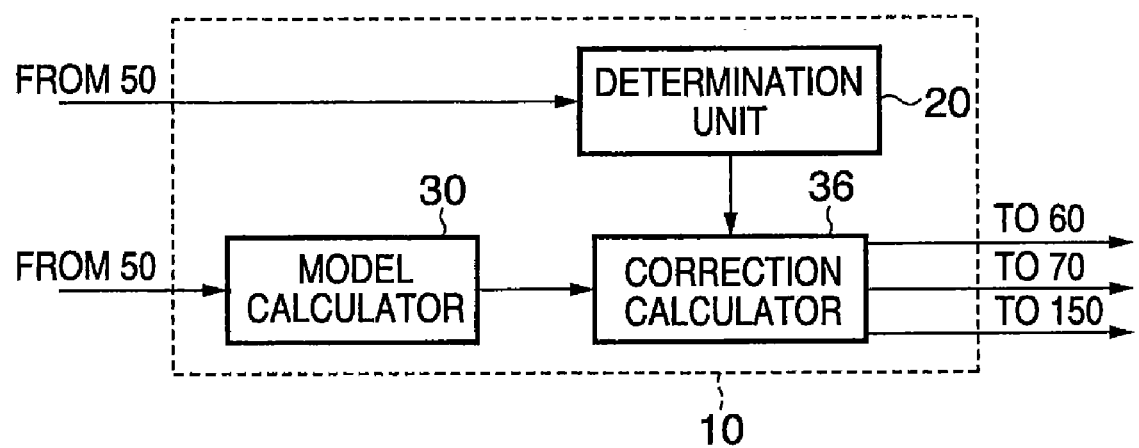
FIG. 3 is a block diagram showing an example of an aberration correction calculator according to the first embodiment of the present invention.

FIG. 3 is a block diagram showing the arrangement of the aberration correction calculator.

The aberration correction calculator 10 comprises a determination unit 20, a model calculator 30, and a correction calculator 36.

The determination unit 20 connects to the main controller 50 and correction calculator 36. The model calculator 30 connects to the main controller 50 and correction calculator 36. The correction calculator 36 connects to the determination unit 20, model calculator 30, lens driving controller 60, laser driving controller 70, and stage driver 150.

The model calculator 30 compensates for exposure period data sent from the main controller 50, based on the exposure period data and the characteristic of the influence of heat produced upon exposure on the lenses 102, 104, 106, 108, and 110 of the projection optical system. In general, the influence of heat, produced upon exposure on the lenses of the projection optical system, is expressed by an nth-order lag characteristic with respect to the exposure period data, and is approximated by a first-order lag characteristic in the simplest terms. This lag characteristic is calculated by, for example, measuring an aberration characteristic obtained by temporally controlling exposure and non-exposure. That is, a memory (not shown) stores the calculated lag characteristic (heat influence characteristic) information in advance. Upon receiving the exposure period data, the model calculator 30 acquires the lag characteristic (heat influence characteristic) information by referring to the memory. Based on the lag characteristic (heat influence characteristic) and exposure period data, the model calculator 30 compensates for the exposure period data and outputs the resultant data.

The determination unit 20 receives information (exposure period data) of, for example, "wafer exchange in progress", "reticle exchange in progress", or "periodical maintenance in progress" from the main controller 50. Based on the exposure period data, the determination unit 20 determines whether to drive the lenses. The determination unit 20 generates a lens driving timing signal (see b in FIG. 4) based on the determination result.

The model calculator 30 receives information (exposure period data) of, for example, "wafer exchange in progress", "reticle exchange in progress", or "periodical maintenance in progress" from the main controller 50. The model calculator 30 compensates for the exposure period data to calculate exposure period compensation data (see c in FIG. 4).

The correction calculator 36 receives the lens driving timing signal from the determination unit 20. The correction calculator 36 receives the exposure period compensation data from the model calculator 30. The correction calculator 36 calculates an amount of lens driving corresponding to an amount of aberration correction based on the lens driving timing signal and exposure period compensation data (see d in FIG. 4). The correction calculator 36 outputs the lens driving amount information to the lens driving controller 60, laser driving controller 70, and stage driver 150.

The lens driving timing signal (see b in FIG. 4) is preferably output a plurality of number of times in the interval from the end of exposure until the start of the next exposure, for example, during wafer exchange or reticle exchange (several tens of seconds) or periodical maintenance (several tens of minutes).

Figure 4:
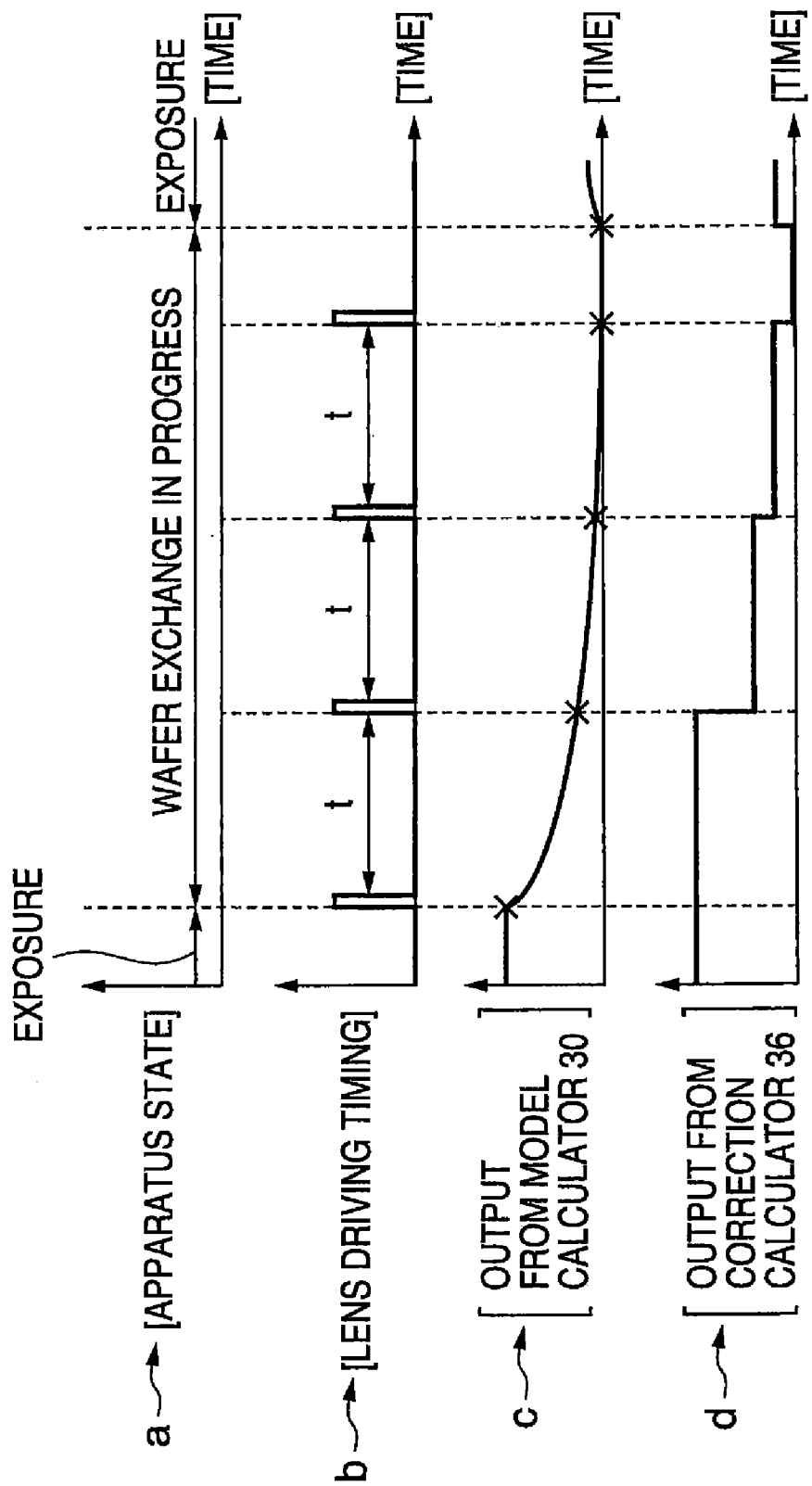
FIG. 4 is an exemplary timing chart according to the first embodiment of the present invention.

The aberration correction calculator 10, shown in FIG. 3, further includes a timer (not shown), and refers to it as needed under the control, shown in FIG. 4. The aberration correction calculator 10 further includes a memory (not shown), which stores the control shown in FIG. 4. More specifically, the memory in the aberration correction calculator 10 stores, for example, control information under which lens driving is performed at a scheduled interval upon a shift from the exposure period to the non-exposure period, with no concern for the (whole) length of the non-exposure period. That is, the aberration correction calculator 10 calculates an amount of aberration correction based on the elapsed time of the non-exposure period.

FIG. 4 is a timing chart representing the operation of the aberration correction calculator. Label a in FIG. 4 indicates the state (exposure period data) of the exposure apparatus 1. Label b in FIG. 4 indicates a lens driving timing signal output from the determination unit 20. Label c in FIG. 4 indicates information, that is, exposure period compensation data output from the model calculator 30. Label d in FIG. 4 indicates lens driving amount information output from the correction calculator 36.

As the state of the exposure apparatus 1, a in FIG. 4 exemplifies an exposure period around the end of exposure, a wafer exchange period ("wafer exchange in progress", i.e., a non-exposure period), and an exposure period around the start of the next exposure. As shown in c of FIG. 4, during the wafer exchange period (non-exposure period), aberration of the lens of the projection optical system changes with time from immediately after the end of exposure, due to the influence of heat produced upon exposure. To the contrary, during the wafer exchange period (see a in FIG. 4), the correction calculator 36 calculates the amount of lens driving (see d in FIG. 4), based on the exposure period compensation data (see c in FIG. 4), output from the model calculator 30, at the timing of lens driving (see b in FIG. 4) output from the determination unit 20.

Assume that the aberration has changed greatly from immediately after the end of exposure until immediately before the start of the next exposure (non-exposure period). If the changed aberration were corrected only immediately before the next exposure period during wafer exchange (non-exposure period), an amount of lens driving immediately before the next exposure period might increase. In this case, as the amount of lens driving increases during the exposure period, the settling time of the lens prolongs. This may result in a decrease in throughput.

To prevent this problem, according to the first embodiment of the present invention, the amount of lens driving is calculated, as indicated by d in FIG. 4, and lens driving is performed even at a timing earlier than that immediately before the exposure period, in the wafer exchange period (non-exposure period). That is, the lens driving controller 60 controls the lens driving mechanism 101 in accordance with information (exposure period data) representing that the non-exposure period has started.

The lens driving controller 60 performs lens driving, not once, but a plurality of times. That is, the lens driving controller 60 performs lens driving a plurality of times based on a predetermined schedule (e.g., for every predetermined time t after the start of the non-exposure period, as shown in FIG. 4).

This makes it possible to suppress the amount of lens driving per one driving.

Aberrations of the lenses of the projection optical system can be changed by moving them in the optical axis direction based on their optical design. It is a common practice to make an optical design, such that the lens driving mechanism moves one lens in the optical axis direction, to largely change one aberration. For example, an optical design is made such that the lens driving mechanism 101 shown in FIG. 1 moves the lens 104 in the optical axis direction, to change the projection magnification. However, other aberrations of, for example, distortion, sphere, coma, astigmatism, and curvature of field sometimes change upon a change in projection magnification, albeit only slightly. If these aberrations pose problems concerning precision, the lens driving mechanism must move the other lenses (e.g., the lenses 102, 106, and 108), in the optical axis direction, to reduce them. It is a common practice to make an optical design, such that the lens driving mechanism moves n lenses in the optical axis direction, to be able to correct n aberrations. Each aberration changes upon changing the wavelength of exposure light. The sensitivity of aberration to a change in wavelength sometimes significantly changes. In this case, aberration correction by moving the n lenses and changing the wavelength of exposure light makes it possible to correct (n+1) aberrations.

Lens driving amount information calculated by the correction calculator 36 is output to the lens driving controller 60. In accordance with this lens driving amount information, the lens driving controller 60 drives the lens driving mechanism 101 and moves the lens 104 along the optical axis PA.

It should be noted that the correction calculator 36 may additionally calculate an amount of wavelength driving for aberration correction. The wavelength driving amount information of exposure light calculated by the correction calculator 36 is input to the laser driving controller 70. In accordance with the input wavelength driving amount information, the laser driving controller 70 controls the driving mechanism 88 of the exposure light source 80 to change the wavelength of the exposure light. This makes it possible to correct (n+1) aberrations by driving the n lenses and changing the wavelength.

The correction calculator 36 may additionally calculate an amount of stage driving for aberration correction. The stage driving amount information calculated by the correction calculator 36 is input to the stage driver 150. In accordance with the input stage driving amount information, the stage driver 150 drives the wafer stage 130 and reticle stage 142. This makes it possible to correct (n+1) aberrations by driving the n lenses and stage.

The correction calculator 36 may additionally calculate an amount of stage driving for focus error correction. Driving the wafer stage 130 or reticle stage 142 along the optical axis PA also allows focus error correction. More specifically, correction using the wafer stage 130 or reticle stage 142 is done in the following way. When a focus error occurs upon the above-described lens or wavelength driving, the correction calculator 36 calculates an amount of stage driving for focus error correction. The calculated amount of stage driving for focus error correction is output to the stage driver 150. In accordance with the input stage driving amount information (correction information), the stage driver 150 moves the wafer stage 130 or reticle stage 142 along the optical axis PA, to correct the focus error. This makes it possible to correct (n+2) aberrations.

As has been described above, according to the first embodiment of the present invention, even in the interval (non-exposure period) from the end of exposure until the start of the next exposure, lens driving is performed a plurality of number of times, in accordance with lens driving amount information calculated based on a lens driving timing signal from exposure period data. Even when aberration of the projection optical system occurs upon exposure, it is corrected a plurality of times. This makes it possible to suppress an increase in the amount of lens driving during the exposure period. This allows a shorter settling time after lens driving, to suppress a decrease in throughput and to improve the exposure accuracy.

It should be noted that, although one lens driving mechanism is shown in FIG. 1, a plurality of lens driving mechanisms may be provided.

For descriptive convenience, the five lenses 102, 104, 106, 108, and 110 are shown in FIG. 1. However, a normal exposure apparatus comprises about twenty to thirty lenses.

The lens driving mechanism 101 may be formed by, for example, a pneumatic actuator or a piezoelectric element.

A lag characteristic used to compensate for exposure period data by the model calculator 30 may be calculated as a heat time constant from, for example, the absorption characteristic of the lens of the projection optical system to exposure light, and the heat capacity of the lens material.

The memory (not shown) in the aberration correction calculator 10 may store a control program under which lens driving is performed at a scheduled timing, in consideration of the whole length of the non-exposure period with the exposure period, non-exposure period, and next exposure period, respectively determined. The determination unit 20 may generate a lens driving timing signal for lens driving at different time intervals, such as time intervals that gradually shorten upon a shift from the exposure period to the non-exposure period. The lens driving timing signal desirably suppresses an increase in the amount of lens driving during the exposure period, owing to at least several times of lens driving before the exposure period. The correction calculator 36 also calculates the wavelength driving amount of exposure light as needed. In this case, the laser driving controller 70 receives the wavelength driving amount information from the correction calculator 36. Based on the wavelength driving amount information, the laser driving controller 70 drives the driving mechanism 88 (see FIG. 2), and changes the wavelength of laser light from the exposure light source 80.

One or a plurality of aberrations of, for example, a focal shift, a projection magnification shift, distortion, sphere, coma, astigmatism, and curvature of field, may be corrected.

The non-exposure period may include, for example, at least one of a wafer exchange period, a reticle exchange period, and a periodical maintenance period.

Figure 5:
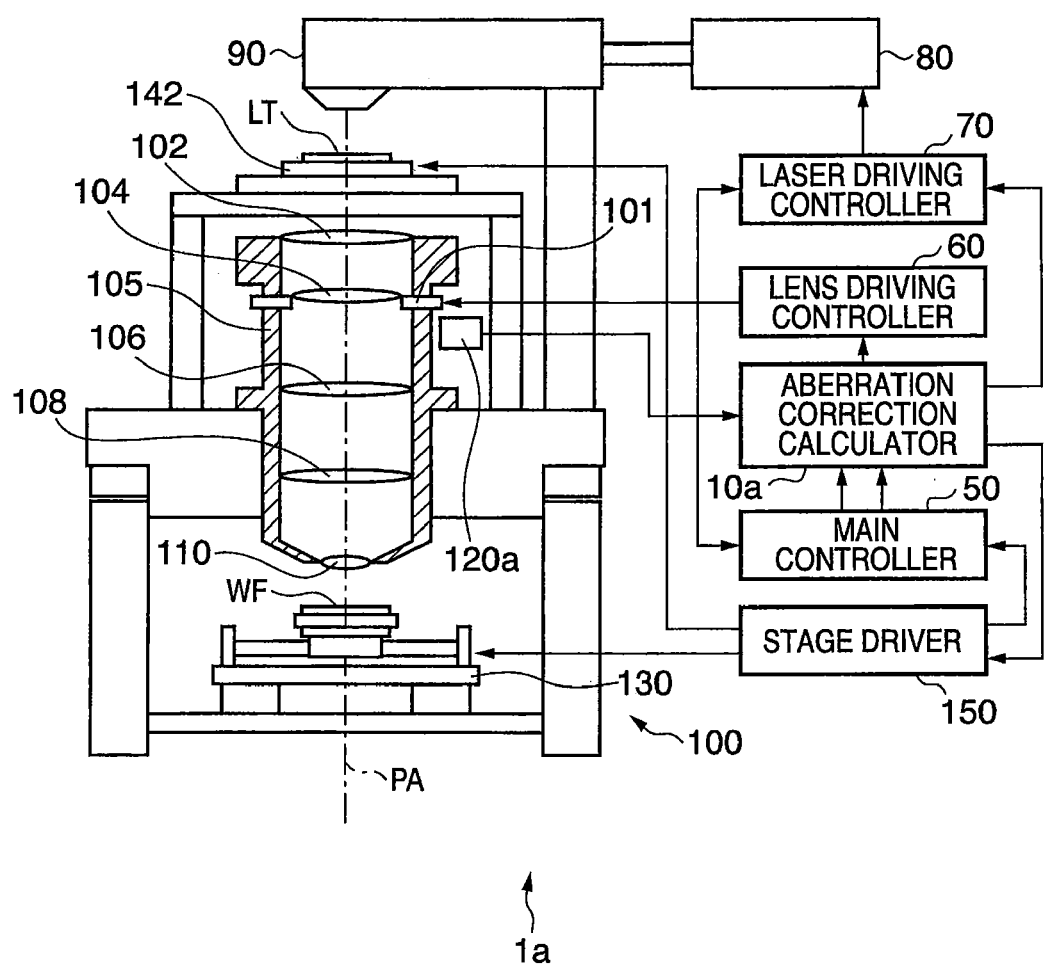
FIG. 5 is a view showing the arrangement of an exposure apparatus according to the second embodiment of the present invention.
Figure 6:
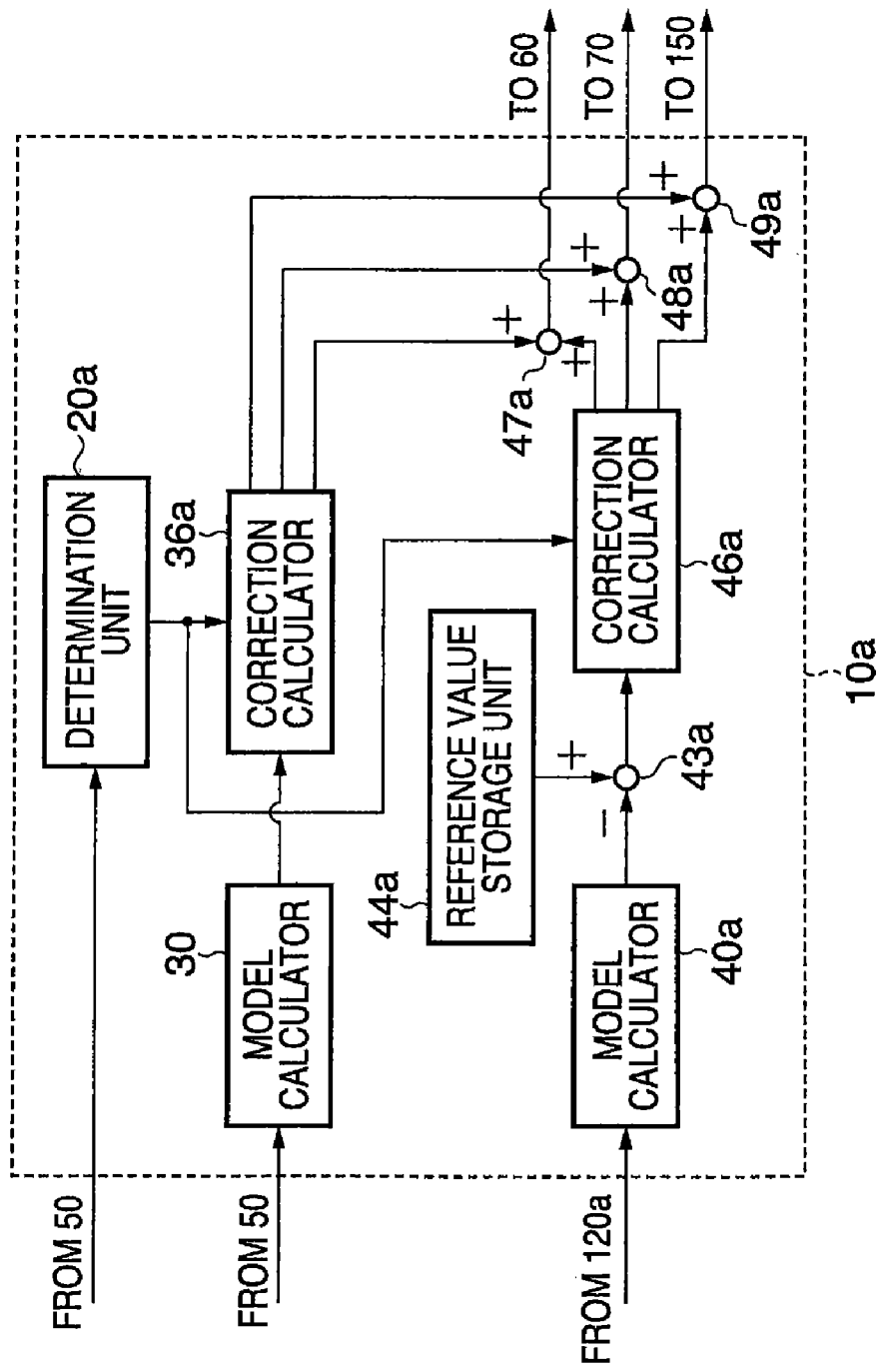
FIG. 6 is a block diagram showing an example of an aberration correction calculator according to the second embodiment of the present invention.
Figure 7:
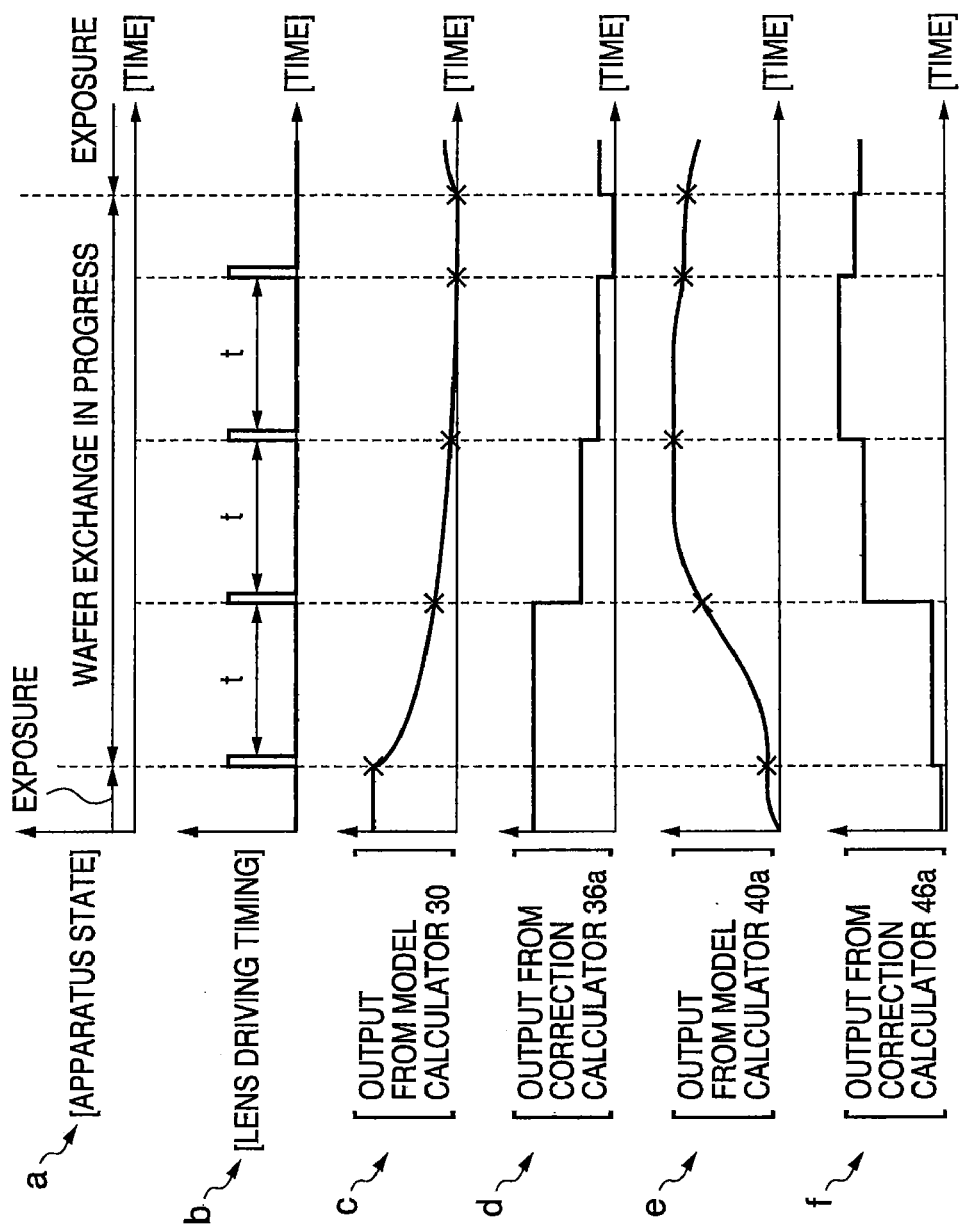
FIG. 7 is an exemplary timing chart according to the second embodiment of the present invention.

The preferred second embodiment of the present invention will be explained with reference to FIGS. 5 to 7. FIG. 5 is a view showing the arrangement of an exposure apparatus according to the second embodiment of the present invention. FIG. 6 is a block diagram showing the arrangement of an aberration correction calculator. FIG. 7 is a timing chart illustrating the operation of the aberration correction calculator. Mainly, parts different from those in the first embodiment will be described, and a description of the similar parts will be omitted.

An exposure apparatus 1a has basically the same arrangement as that in the first embodiment, but is different in that an aberration correction calculator 10a substitutes for the aberration correction calculator 10, and the exposure apparatus 1a further comprises an atmospheric pressure detector 120a. The atmospheric pressure detector 120a includes, for example, a barometer.

In the first embodiment, the main controller 50 generates exposure period data based on information about an exposure period and a non-exposure period. Based on the exposure period data, the aberration correction calculator 10 calculates an amount of lens driving, or the like, for aberration correction.

In the second embodiment, the atmospheric pressure detector 120a measures the atmospheric pressure and generates atmospheric pressure data. Based on the exposure period data and atmospheric pressure data, the aberration correction calculator 10a calculates an amount of lens driving, or the like, for aberration correction. A lens driving controller 60 drives a lens driving mechanism 101 in accordance with the data (atmospheric pressure data) corresponding to a change in atmospheric pressure. This allows aberration correction, even when aberration occurs upon a change in atmospheric pressure.

The atmospheric pressure detector 120a measures the atmospheric pressure around a projection optical system (including lenses 102, 104, 106, 108, and 110). The atmospheric pressure detector 120a may be arranged around, or built in, an exposure light source 80 or an illumination optical system 90. The aberration correction calculator 10a receives a signal (atmospheric pressure data) output from the atmospheric pressure detector 120a. The atmospheric pressure data exhibits a change in atmospheric pressure.

The arrangement and operation of the aberration correction calculator 10a will be explained with reference to FIGS. 6 and 7. FIG. 6 is a block diagram showing the arrangement of the aberration correction calculator.

The aberration correction calculator 10a comprises a determination unit 20a and correction calculator 36a, in place of the determination unit 20 and correction calculator 36, respectively. The aberration correction calculator 10a further comprises a model calculator 40a, reference value storage unit 44a, correction calculator 46a, and adders 43a, 47a, 48a, and 49a.

The determination unit 20a connects to a main controller 50 and the correction calculators 36a and 46a. The correction calculator 36a connects to the determination unit 20a, a model calculator 30, and the adders 47a, 48a, and 49a. The model calculator 40a connects to the atmospheric pressure detector 120a and adder 43a. The reference value storage unit 44a connects to the adder 43a. The correction calculator 46a connects to the determination unit 20a and adders 43a, 47a, 48a, and 49a. The adder 43a connects to the model calculator 40a, reference value storage unit 44a, and correction calculator 46a. The adder 47a connects to the correction calculators 36a and 46a and lens driving controller 60. The adder 48a connects to the correction calculators 36a and 46a and a laser driving controller 70. The adder 49a connects to the correction calculators 36a and 46a and a stage driver 150.

The model calculator 40a compensates for atmospheric pressure data measured by the atmospheric pressure detector 120a, based on the characteristics of the ambient atmospheric pressure of lenses 102, 104, 106, 108, and 110 of the projection optical system. In general, the ambient atmospheric pressure, of the lenses of the projection optical system, is expressed by an nth-order lag characteristic, with respect to a change in the atmospheric pressure of the inside of the exposure apparatus, and is approximated by a first-order lag characteristic, in the simplest terms.

Assume, for example, that the atmospheric pressure detector 120a is arranged outside the projection optical system. The lag characteristic in this case is calculated as a first-order lag time constant by measuring a pressure characteristic in the atmospheric pressure detector 120a and the characteristic of the ambient atmospheric pressure of the lenses in advance. That is, a memory (not shown) stores the obtained lag characteristic (pressure influence characteristic) information in advance. Upon receiving the atmospheric pressure data, the model calculator 40a acquires the lag characteristic (pressure influence characteristic) information by referring to the memory. Based on the lag characteristic (pressure influence characteristic) and atmospheric pressure data, the model calculator 40a compensates for the atmospheric pressure data and outputs the resultant data.

The model calculator 40a receives information (atmospheric pressure data) indicating the magnitude of the measured atmospheric pressure from the atmospheric pressure detector 120a. The model calculator 40a compensates for the atmospheric pressure data to calculate atmospheric pressure compensation data (see e in FIG. 7).

The adder 43a compares the atmospheric pressure compensation data sent from the model calculator 40a with an atmospheric reference value sent from the reference value storage unit 44a. The adder 43a then calculates their difference as atmospheric pressure compensation change data, and sends the resultant data to the correction calculator 46a.

The correction calculator 46a receives a lens driving timing signal from the determination unit 20a. The correction calculator 46a calculates an amount of lens driving (see f in FIG. 7) corresponding to an amount of aberration correction based on the lens driving timing signal (see b in FIG. 7) and atmospheric pressure compensation change data (data based on the comparison between the atmospheric pressure compensation data and the reference value; shown in e in FIG. 7).

The correction calculators 36a and 46a each send lens driving amount information to the adders 47a, 48a, and 49a. The adder 47a adds an amount of lens driving (see d in FIG. 7) input from the correction calculator 36a to an amount of lens driving (see f in FIG. 7) input from the correction calculator 46a, and outputs the resultant information to the lens driving controller 60 as final lens driving amount information. The adder 48a adds the amounts of lens driving input from the correction calculators 36a and 46a, and outputs the resultant information to the laser driving controller 70 as final lens driving amount information. The adder 49a adds the amounts of lens driving input from the correction calculators 36a and 46a, and outputs the resultant information to the stage driver 150 as final lens driving amount information.

FIG. 7 is a timing chart illustrating the operation of the aberration correction calculator. Labels a to d in FIG. 7 are the same as those in FIG. 4 of the first embodiment, and a description thereof will be omitted. Labels e and f in FIG. 7 will be mainly explained. Label e in FIG. 7 refers to information output from the model calculator 40a, in other words, atmospheric pressure compensation data. Label f in FIG. 7 refers to lens driving amount information output from the correction calculator 46a. The correction calculator 46a calculates this lens driving amount at a lens driving timing output from the determination unit 20a shown as b in FIG. 7, on the basis of the difference between the outputs from the model calculator 40a and reference value storage unit 44a.

Assume here that the aberration has changed greatly upon a large change in atmospheric pressure from immediately after the end of exposure until just before the start of the next exposure (non-exposure period). If the changed aberration were corrected only immediately before the next exposure period, during wafer exchange (non-exposure period), an amount of lens driving immediately before the next exposure period might increase. In this case, as the amount of lens driving increases immediately before the next exposure period, the settling time of the lens prolongs. This may result in a decrease in throughput.

To prevent this problem, according to the second embodiment of the present invention, the amount of lens driving is calculated as indicated by d in FIG. 7, and lens driving is performed even during the wafer exchange period (non-exposure period). The lens driving controller 60 performs lens driving, not once, but a plurality of times. This makes it possible to suppress the lens driving amount per one driving.

As has been described above, according to the second embodiment of the present invention, even in the interval (non-exposure period) from the end of exposure until the start of the next exposure, lens driving is performed a plurality of times, in accordance with lens driving amount information calculated based on a lens driving timing signal from exposure period data and atmospheric pressure data. Even when aberrations of the projection optical system occur upon exposure and a change in atmospheric pressure, they are corrected a plurality of times. This makes it possible to suppress an increase in the amount of lens driving immediately before the exposure period. This allows a shorter settling time after lens driving, to suppress a decrease in throughput, and to improve the exposure accuracy.

It should be noted that, if the atmospheric pressure detector 120a is built in the projection optical system, a time constant serving as the lag characteristic is small. Hence, the model calculator 40a itself can be omitted.

The correction calculators 36a and 46a each may additionally calculate a wavelength driving amount (for aberration correction). The adder 48a adds the wavelength driving amounts input from the correction calculators 36a and 46a. The adder 48a may output the sum to the laser driving controller 70, as final wavelength driving amount information, in place of the final lens driving amount information.

The correction calculators 36a and 46a each may additionally calculate a stage driving amount (for aberration correction). The adder 49a adds the stage driving amounts input from the correction calculators 36a and 46a. The adder 49a may output the sum to the stage driver 150, as final stage driving amount information, in place of the final lens driving amount information.

The correction calculators 36a and 46a each may additionally calculate a stage driving amount for focus error correction. The aberration correction calculator 10a shown in FIG. 6 further includes a timer (not shown), and refers to it as needed, under the control shown in FIG. 7.

The non-exposure period may include, for example, at least one of a wafer exchange period, a reticle exchange period, and a periodical maintenance period.

Figure 8:
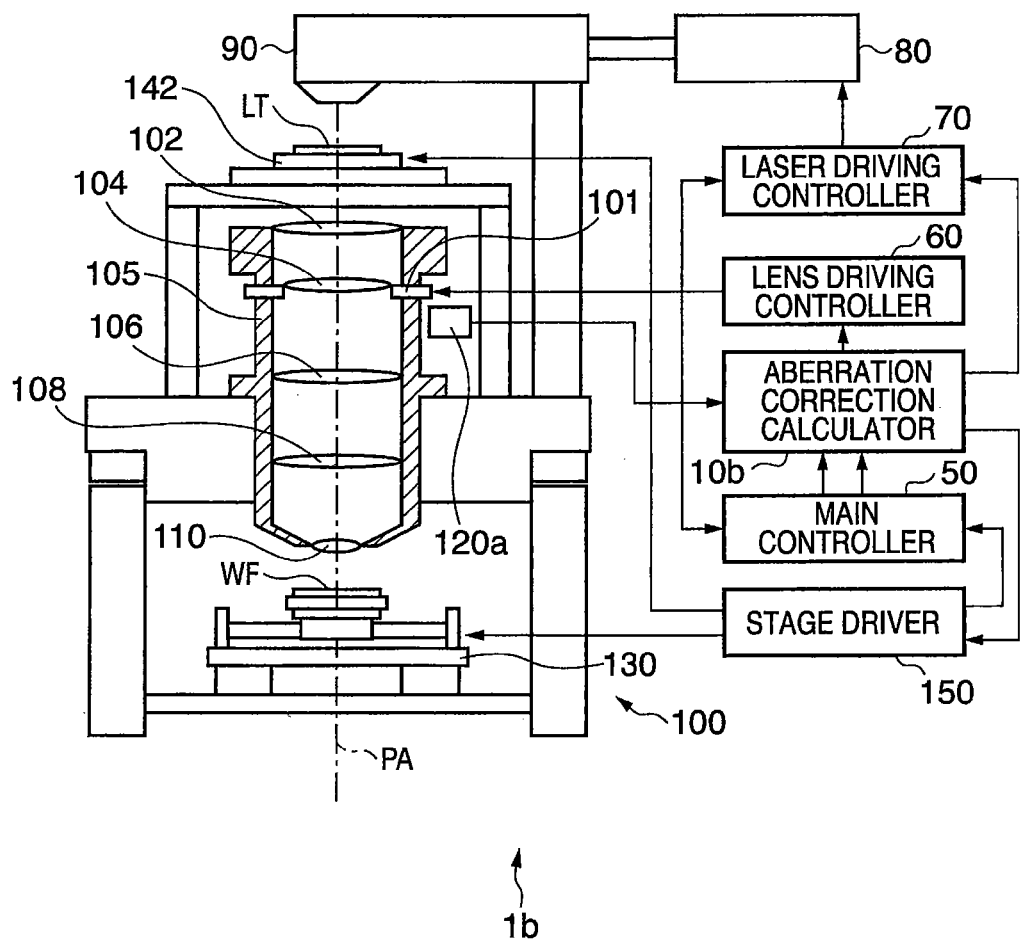
FIG. 8 is a view showing the arrangement of an exposure apparatus according to the third embodiment of the present invention.
Figure 9:
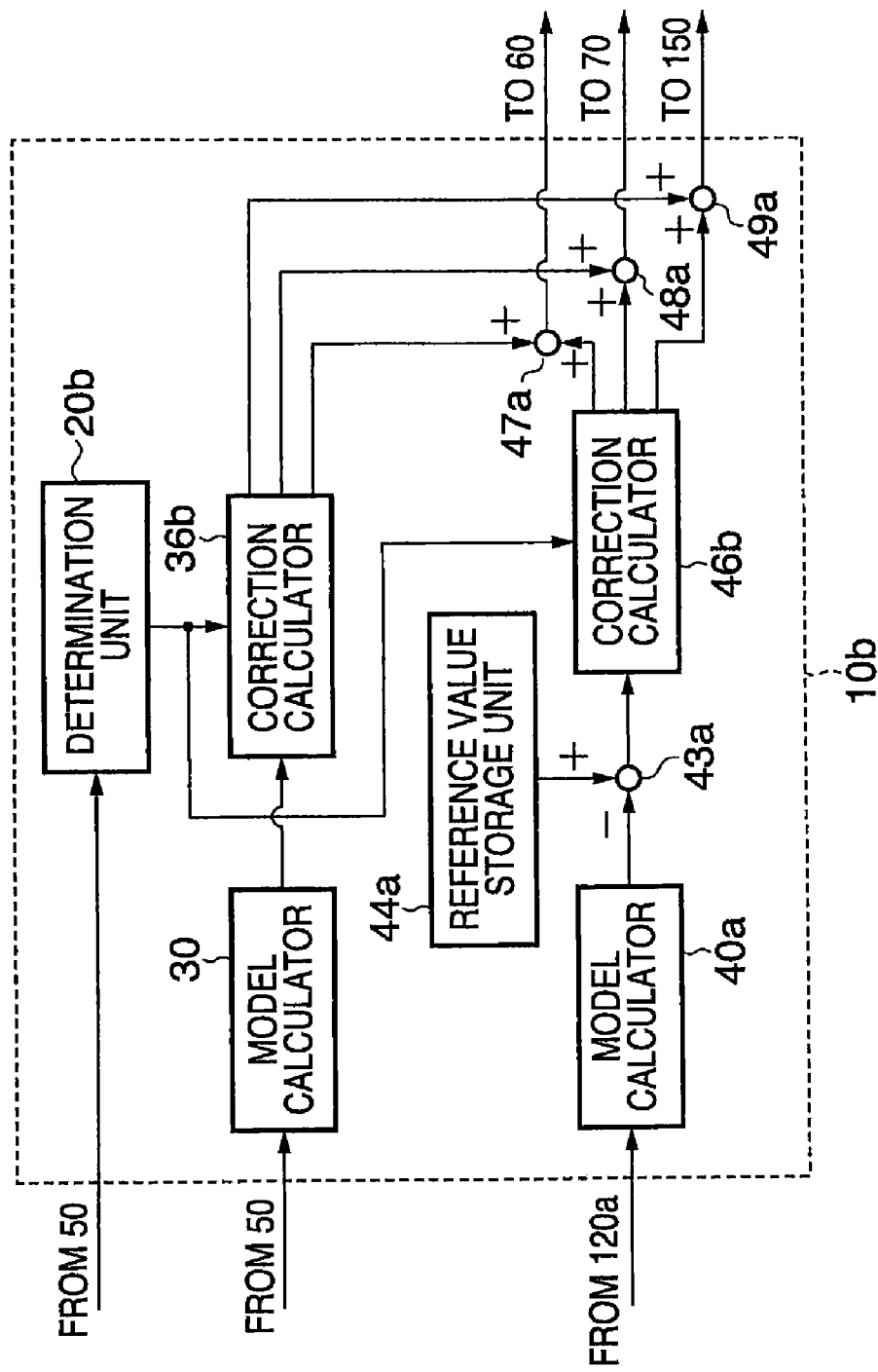
FIG. 9 is a block diagram showing an example of an aberration correction calculator according to the third embodiment of the present invention.
Figure 10:
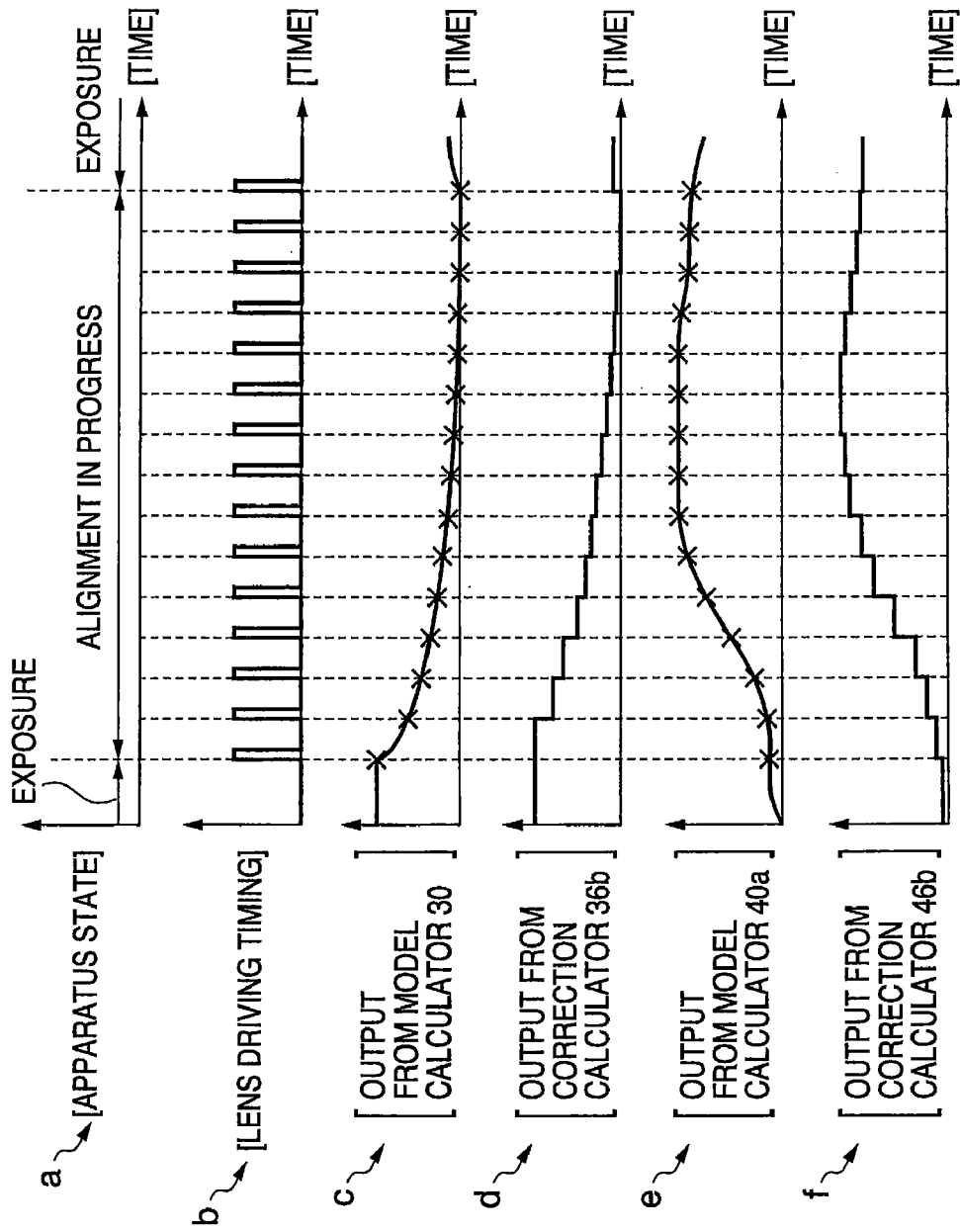
FIG. 10 is an exemplary timing chart according to the third embodiment of the present invention.

The preferred third embodiment of the present invention will be explained with reference to FIGS. 8 to 10. FIG. 8 is a view showing the arrangement of an exposure apparatus according to the third embodiment of the present invention. FIG. 9 is a block diagram showing the arrangement of an aberration correction calculator. FIG. 10 is a timing chart illustrating the operation of the aberration correction calculator. Mainly, parts different from those in the first and second embodiments will be described, and a description of the similar parts will be omitted.

An exposure apparatus 1b has basically the same arrangement as that in the first and second embodiments, but is different in that an aberration correction calculator 10b substitutes for the aberration correction calculator 10.

The aberration correction calculator 10b shown in FIG. 9 comprises a determination unit 20b and correction calculator 36b, in place of the determination unit 20 and correction calculator 36, respectively. The aberration correction calculator 10b further comprises a correction calculator 46b. The aberration correction calculator 10b calculates a lens driving amount, even during an alignment measurement period. That is, the non-exposure period further includes an alignment measurement period, in the third embodiment.

FIG. 10 is a timing chart illustrating the operation of the aberration correction calculator 10b according to the third embodiment. Label a in FIG. 10 refers to the state (exposure period data) of the exposure apparatus 1b. Label b in FIG. 10 refers to a lens driving timing signal output from the determination unit 20b. Label d in FIG. 10 refers to lens driving amount information output from the correction calculator 36b. Label f in FIG. 10 refers to lens driving amount information output from the correction calculator 46b.

As the state of the exposure apparatus 1b, a in FIG. 10 exemplifies an exposure period around the end of exposure, an alignment measurement period ("alignment measurement in progress"), and an exposure period around the start of the next exposure. Labels b to f in FIG. 10 refer to outputs that correspond to those referred to by b to f in FIG. 7. As shown in b of FIG. 10, even during the alignment measurement period, the determination unit 20b generates a lens driving timing based on information (exposure period data) of, for example, "alignment in progress", which is input from the main controller 50. As shown in d and f of FIG. 10, the correction calculators 36b and 46b each calculate a lens driving amount. In accordance with the pieces of calculated lens driving amount information, the lens driving controller 60 controls the lens driving mechanism 101 to move the lens in the optical axis direction. This allows continuous aberration correction during alignment measurement.

As has been described above, according to the third embodiment of the present invention, even during the alignment measurement period ("alignment measurement in progress"), lens driving is performed a plurality of times, in accordance with lens driving amount information calculated based on a lens driving timing signal from exposure period data and atmospheric pressure data. Even when aberrations of the projection optical system occur, due to heat produced upon exposure and due to a change in atmospheric pressure, they are corrected a plurality of times. This makes it possible to suppress an increase in the amount of lens driving immediately before the exposure period. Even when a long alignment period of time is spent to improve the overlay accuracy, or when the atmospheric pressure greatly changes during alignment measurement, the settling time after lens driving can be shortened, to suppress a decrease in throughput and to improve the exposure accuracy.

Aberration correction also allows an improvement in exposure accuracy by reducing alignment measurement errors.

It should be noted that, if alignment measurement requires a non-negligible amount of light, the model calculator 30 in the aberration correction calculator 10b shown in FIG. 9 may calculate exposure period compensation data, in consideration of the alignment measurement light amount, like the exposure period data.

The correction calculators 36b and 46b each may additionally calculate a wavelength driving amount. An adder 48a adds the wavelength driving amounts input from the correction calculators 36b and 46b. The adder 48a may output the sum to a laser driving controller 70, as final wavelength driving amount information, in place of the final lens driving amount information.

The correction calculators 36b and 46b each may additionally calculate a stage driving amount. An adder 49a adds the stage driving amounts input from the correction calculators 36b and 46b. The adder 49a may output the sum to a stage driver 150, as final stage driving amount information, in place of the final lens driving amount information.

Figure 11:
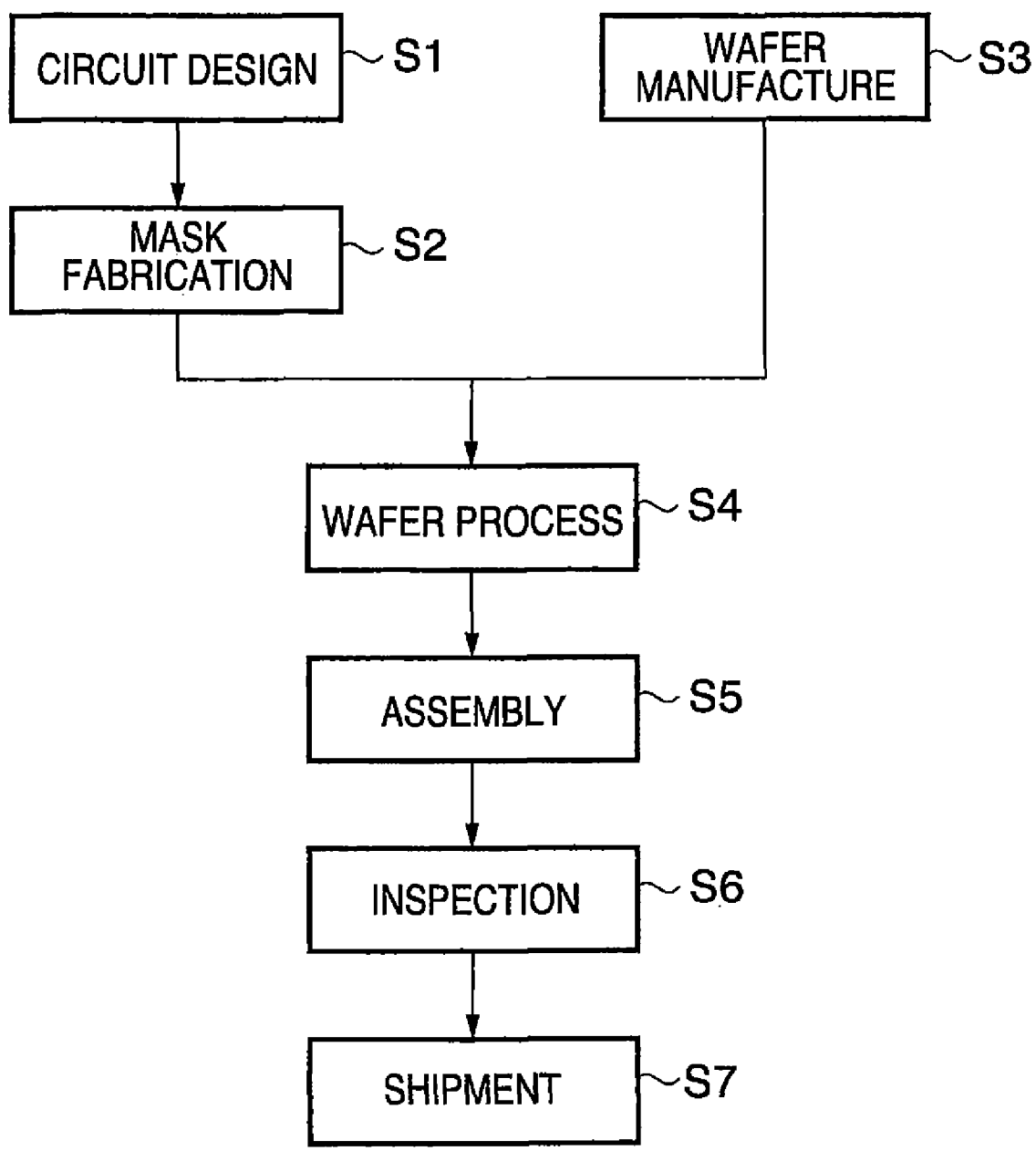
FIG. 11 is a flowchart illustrating the overall process of manufacturing a semiconductor device.

A process (method) of manufacturing a device using an exemplary exposure apparatus, to which a wafer stage apparatus according to the present invention is applied, will be explained next with reference to FIG. 11. FIG. 11 is a flowchart illustrating the overall process of manufacturing a semiconductor device as an example of the device.

In step S1 (circuit design), the circuit of a semiconductor device is designed.

In step S2 (mask fabrication), a mask is fabricated on the basis of the designed circuit pattern.

In step S3 (wafer manufacture), a wafer is manufactured using a material, such as silicon.

In step S4 (wafer process), called a pre-process, the above-described exposure apparatus forms an actual circuit on the wafer by lithography using the mask and wafer.

In step S5 (assembly), called a post-process, a semiconductor chip is formed using the wafer manufactured in step S4. This step includes an assembly step (dicing and bonding) and a packaging step (chip encapsulation).

In step S6 (inspection), the semiconductor device manufactured in step S5 undergoes inspections, such as an operation confirmation test and a durability test. After these steps, the semiconductor device is completed and shipped in step S7 (shipment).

The wafer process in step S4 includes an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of exposing, using the above-described exposure apparatus, the wafer having undergone the resist processing step to light, via the mask pattern, to form a latent image pattern on the resist, a development step of developing the wafer exposed in the exposure step, an etching step of etching portions other than the latent image pattern developed in the development step, and a resist removal step of removing any unnecessary resist remaining after etching. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus for exposing a substrate to light during an exposure period, said apparatus comprising:
   a projection optical system configured to project light from a pattern of a reticle onto the substrate, said projection optical system including at least one optical element driven to adjust aberration of said projection optical system;
   a first calculator configured to calculate compensation data based on a temporal characteristic of heat influence, which represents a change in aberration due to heat influence of the exposure in said projection optical system in accordance with (i) an elapsed time of a non-exposure period from a time when the exposure period shifts to a non-exposure period, and (ii) exposure period data, which represents the time when the exposure period shifts to the non-exposure period;
   a second calculator configured to calculate each of a plurality of driving amounts of the at least one optical element, based on the compensation data calculated by the first calculator, and each of a plurality of timing signals generated at a gradually decreasing interval upon a shift from the exposure period to the non-exposure period, on the basis of the exposure period data; and
   a driver configured to drive the at least one optical element a plurality of times during the non-exposure period based on each of the plurality of driving amounts calculated by the second calculator.

2. A method of manufacturing a device, said method comprising steps of:
   exposing a substrate to light using an exposure apparatus as defined in claim 1;
   developing the exposed substrate; and
   processing the developed substrate to manufacture the device.

3. An apparatus according to claim 1, wherein the temporal characteristic of heat influence is calculated as a heat time constant from an absorption characteristic of the at least one optical element to exposure light, and a heat capacity of a material of the at least one optical element.

4. An apparatus according to claim 1, further comprising:
   an atmospheric pressure detector configured to detect atmospheric pressure and to output atmospheric pressure data;
   a third calculator configured to calculate atmospheric pressure compensation data based on a temporal characteristic of ambient atmospheric pressure and the atmospheric pressure data output by the atmospheric pressure detector; and
   a fourth calculator configured to calculate a second driving amount of the at least one optical element based on a difference between a reference value of atmospheric pressure and the atmospheric pressure compensation data calculated by the third calculator, and the timing signals,
wherein the driver drives the at least one optical element a plurality of times during the non-exposure period based on the driving amount calculated by the second calculator and the second driving amount calculated by the fourth calculator.

5. An apparatus according to claim 1, wherein the non-exposure period includes at least one of a substrate exchange period, a reticle exchange period, a period of maintenance for said apparatus, and a period of measurement performed by said projection optical system for aligning the reticle and the substrate.

* * * * *